United States Patent [19]

Sinclair

[11] Patent Number: 5,329,227
[45] Date of Patent: Jul. 12, 1994

[54] TEST SOCKET ASSEMBLY FOR TESTING LCC PACKAGES OF BOTH RECTANGULAR AND SQUARE CONFIGURATION

[75] Inventor: William Y. Sinclair, Frenchtown, N.J.

[73] Assignee: Aries Electronics, Inc., Frenchtown, N.J.

[21] Appl. No.: 63,528

[22] Filed: May 18, 1993

[51] Int. Cl.⁵ ............................................. G01R 1/04
[52] U.S. Cl. ............................ 324/158.1; 439/357; 439/526; 439/331; 439/372; 324/754
[58] Field of Search ............... 439/525, 526, 330, 331, 439/357, 372; 324/158 F, 158 P

[56] References Cited

U.S. PATENT DOCUMENTS

| | | | |
|---|---|---|---|
| 4,222,577 | 9/1980 | Giffin | 279/114 |
| 4,739,257 | 4/1988 | Jenson et al. | 324/158 F |
| 4,835,469 | 5/1989 | Jones et al. | 324/158 F |
| 4,923,404 | 5/1990 | Redmond et al. | 439/71 |

Primary Examiner—Kenneth A. Wieder
Assistant Examiner—Barry C. Bowser
Attorney, Agent, or Firm—Anthony J. Casella; Gerald E. Hespos

[57] ABSTRACT

A universal LCC test socket assembly for making solderless connections between the leads of either a rectangular or square configured LCC packaged IC and a testing device includes a top member having spring biased securing members for temporarily securing a LCC packaged IC, and a base member including a plurality of electrical contacts that extend beyond the base member for electrical connection to the testing device.

17 Claims, 5 Drawing Sheets

TEST SOCKET ASSEMBLY FOR TESTING LCC PACKAGES OF BOTH RECTANGULAR AND SQUARE CONFIGURATION

BACKGROUND OF THE INVENTION

The subject invention relates to a new and improved universal LCC test socket assembly for temporarily connecting the conductive leads of an LCC surface mounted device to an electric testing device during a test and evaluation procedure.

The term LCC is intended to include leaded chip carriers or chip carrier packages that typically consist of one or more circuit chips mounted on a lead frame and encapsulated within an electrically non-conductive housing. In one exemplary type, the encapsulating housing is of a plastic or plastic like material, hence the designation PLCC for plastic leaded chip carrier. In another exemplary type, the encapsulating housing is of a ceramic or ceramic-like material, hence the designation CLCC for ceramic leaded chip carrier.

In the manufacture and use of integrated circuits ("IC") packaged as surface mounted devices, it is important to electrically test such devices accurately, reliably, and quickly. In the LCC device, the IC circuit is contained in a non-conductive housing having a generally square or rectangular, box-like configuration. Generally speaking, LCC packages house memory and microprocessor integrated circuit chips requiring large numbers of conductive leads. LCC's typically include either two rows of conductive leads or terminals along opposed parallel sides of the housing or four rows of conducting leads, one along each side of the housing. The most common configuration of LCC's include four rows of conductive leads contained on either a generally square or rectangular, box-like housing. The conductive leads of a LCC are relatively flexible and extend laterally outwardly from the housing of the semiconductor circuit and are bent downwardly and inwardly, so that the leads curl under the housing of the semiconductor circuit. At such time, the leads are disposed generally in a common plane. A typical LCC may have from 20 to 84 terminals or conductive leads arranged in four equal groups along each side of the housing. For example, a 20-lead LCC has five leads per side. The conductive leads are typically positioned on 0.050 inch centers along each side of the LCC, with each lead having a side portion exposed at the bottom of the housing.

A LCC is designed to be mounted directly on the surface of a circuit board or within a suitable receiving socket of a circuit board, hence the designation surface mounted device. A LCC is typically mounted on the surface of a printed circuit board using a soldering technique to mechanically and electrically attach each conductive lead to a respective solder land on the printed circuit board.

The LCC can be distinguished from dual-in-line packaged (DIP) integrated circuits in that DIP devices are intended for mounting with leads, or more commonly connecting pins, passing through the surface of the circuit board (or within a suitable socket) as opposed to mounting on the surface of the circuit board. Additionally, DIP's typically include only two rows of parallel connecting leads, in contrast to the usual four-rows of conductive leads of the LCC.

Due to the ever increasing use of LCC's, it has become desirable to provide a test socket assembly that may be used to make electrical connections with each of the conductive leads of a LCC surface mounted device for signal testing and/or signal injecting purposes. Because the conductive leads are located along each of the four sides of the LCC, prior art test assemblies for DIP packages generally could not be used effectively even if appropriately sized since they would permit electrical connections with conductive leads at only two opposed sides of the LCC.

Of critical importance, when designing a LCC test socket assembly, the LCC leads tend to be very soft, flexible and hence delicate. For instance, the conductive leads contained within LCC surface-mount devices are frequently provided with solder joints which are sensitive to external pressures and therefore any ensuing contacts with a testing assembly should be carefully conducted so as to avoid fracturing the solder joints. A force component as small as a few grams in a direction parallel to the plane of the LCC could result in fracture of the solder joints of each conductive lead. A single lead of an LCC damaged in testing can render the entire LCC unsuitable for use.

Still another critical design consideration is the alignment system which is utilized in the test socket assembly for aligning the LCC conductive leads with the appropriate contact points of the testing apparatus. Misalignment of the LCC leads from the appropriate contacts on the testing apparatus could render the entire testing procedure useless.

Yet another critical design consideration is the adaptability of the testing apparatus to be capable of testing different configurations of LCC's, i.e., square as well as rectangular configured LCC's.

In summary, there exists a requirement in the electronics industry for a universal test socket assembly for testing LCC packages which have large numbers of fragile conductive leads. The need for such a test socket assembly is especially critical because of the expanding use of LCC surface-mount packages, and the fact that such packages are presently particularly difficult to test. LCC devices are difficult to test because the LCC packages can easily become skewed from a square position relative to the test circuit board, and because of the need to avoid undue pressure contact between the conductive leads of the LCC and the conductive contacts of a test assembly. There is also a need for a universal test assembly that does not cause undue delays during testing and is readily adaptable for testing LCC integrated circuit packages mounted in various patterns on different configured housings.

It is therefore a primary object of the invention to provide a universal test socket assembly for both square and rectangular configured LCC's.

A further object of the subject invention is to provide a universal LCC test socket assembly which does not bend or fracture the delicate LCC leads of a LCC during a test procedure.

Yet another object of the subject invention is to provide a universal LCC test socket assembly which properly positions and holds a LCC while aligning the respective conductive leads with the appropriate electrical contacts on the test socket assembly.

Still another object of the subject invention is to provide a universal LCC test socket assembly which provides an electrical test assembly that can be connected with, and disconnected from, a LCC packaged IC with a relatively small amount of force being applied to the conductive leads of the LCC.

A further object of the subject invention is to provide a universal LCC test socket assembly which readily achieves electrical interconnection between the leads of the LCC and the testing circuit, without subjecting the conductive leads to excessive forces that could result in damage to the leads.

Still a further object of the subject invention is to provide a universal LCC test socket assembly that is inexpensive to manufacture, and can be readily operated by unskilled labor.

SUMMARY OF THE INVENTION

The subject invention provides for a universal LCC test socket assembly for receiving a LCC packaged IC having a plurality of conductive leads. More particularly, the present invention provides a universal test socket assembly that makes electrical connections with the conductive leads located at all sides of the LCC, thereby facilitating solderless electrical access to the respective conductive leads by an external electrical device such as a circuit, test equipment, signal injecting equipment and signal analyzing equipment. The subject invention further provides for a new and improved LCC testing assembly capable of receiving a LCC packaged IC of either a generally square or rectangular box-like configuration. Advantages afforded by the invention include, assurance that the LCC will be properly positioned in relation to the test assembly and held in proper operative position once installed, with minimal applied force so as to avoid possible damage to the conductive leads of the LCC packaged IC. It should also be noted that the subject test assembly accommodates all types of LCC packaged IC's, such as PLCC's and CLCC's.

The universal LCC test socket assembly of the subject invention is generally square and includes a non-conductive base assembly member hinged to a non-conductive detachable top assembly. The non-conductive detachable top assembly pivotally connects to the non-conductive base assembly member through a clevis pin and accompanying hinge members.

The non-conductive base assembly includes a planar bottom wall with interconnected sidewalls upwardly extending therefrom. Mounting on the upper surface of the planar bottom wall are a plurality of contact assemblies. The latter are each provided with parallel rows of conductive contacts for electrical connection with respective conductive leads of a LCC packaged IC disposed in place in the subject test assembly. Moreover, each conductive contact is separated from each adjacent parallel conductive contact by a non-conductive insulating rib forming a portion of the non-conductive base member. Additionally, each conductive contact includes a contact pin which projects downwardly through the planar bottom wall of the non-conductive base assembly. Moreover, each contact pin is designed to be received into a test socket of, for example, an electronic testing apparatus.

The detachable top assembly of the subject invention includes a planar bottom wall and a perimeter sidewall. A generally square planar dog plate is mounted in spaced parallel relationship to the inside surface of the bottom planar wall. The dog plate is provided with four elongated through slots which are each respectively positioned intermediate the center point of the dog plate and each respective corner of the dog plate. Slidable mounting in each through slot is a gripper dog, each of which includes an angled gripper member dimensioned to accommodate the corner edge of an LCC. The four gripper dogs facilitate the temporary gripping of a LCC in the subject test assembly during a testing operation. Additionally, each gripper dog includes a gripper adaptor which enables the four gripper dogs to temporarily register either a square or a rectangular LCC to the dog plate of the test assembly. Moreover, each gripper dog is provided with a dog post which extends downwardly through the associated slot in the dog plate for enabling actuation of each gripper dog along the length of each respective through slot of the dog plate.

A cam wheel is rotatable mounted to the opposite side of the dog plate, and is provided with four uniformly spaced, elongated cam slots. The outer circumferential edge of the cam wheel is provided with an elongated cam wheel handle for enabling manual reciprocal movement of the cam wheel along the surface of the dog plate. A torsion spring biases the cam wheel to its closed position so that the gripper dogs are in their minimum spaced condition, as more fully described hereinafter. The detachable top assembly is designed such that when the elongated cam wheel handle is spring biased to its closed position, the four gripper dogs are uniformly positioned in close proximity to the center point of the dog plate. When the cam wheel handle is manually activated to its maximum open position, the four gripper dogs reciprocally slide away from each other in their respective cam slots being uniformly positioned at a spaced relationship from the center point of the dog plate.

A latch assembly and corresponding latch receiving portion are provided on the respective sidewalls of the base assembly and detachable top assembly opposite from the hinged connection of the assembly. The latch assembly and latch receiving portion enable the base member and top member of the subject test assembly to temporarily engage in a locked and closed position.

In use, with the universal LCC test socket assembly in its open condition, the operator temporarily fastens the LCC packaged IC in the subject assembly by first actuating the elongated cam wheel handle to its maximum open position, and while retaining the handle in the latter position, the operator positions the LCC about the center point on the dog plate with the bottom surface of the conductive leads face up. The operator allows the spring-biased elongated cam wheel handle to slowly retract towards its initial rest position until such time as the four gripper dogs engage the four corners of the LCC. The torsion spring ensures that the cam wheel remains in the latter position and thus the LCC is temporarily registered to the surface of dog plate of the detachable top assembly. Next, the operator pivots the top assembly about the hinge and locks the top detachable assembly to the base assembly by engagement of the latch assembly. Thereafter, each contacting lead on the LCC is forcible urged into electrical contact with a corresponding conductive contact in the base assembly. Since each conductive contact is provided with a resilient portion, it may deflect downwardly thereby avoiding undue pressure between each conductive contact and each LCC conductive lead. The operator then ensures that each contact pin which respectively extends from each conductive contact is secured in a plurality of sockets provided on a testing device. At this time, the operator then tests the electrical characteristics of the LCC surface mounted device which is securely fastened in the subject universal LCC test socket assembly.

After the testing procedure is complete, the operator disconnects the latch assembly from the latch receiving portion, after which the operator pivotally rotates the base assembly relative to the detachable top assembly. The operator then removes the LCC surface mounted device from the detachable top assembly by actuating the elongated cam wheel handle against the biasing force of the torsion spring so as to move the four gripper dogs to their maximum open position. After the LCC surface mounted device is removed, the operator allows the cam wheel handle to return to its initial closed position.

Because of the reciprocally slidable gripper dogs and the unique configuration of the conductive contacts, LCC's of various sizes and shapes may be readily accommodated and tested using the universal test socket of the subject invention in a quick and efficient manner, at minimum cost.

DETAILED DESCRIPTION OF THE PREFERRED EMBODIMENT

Figure 1:
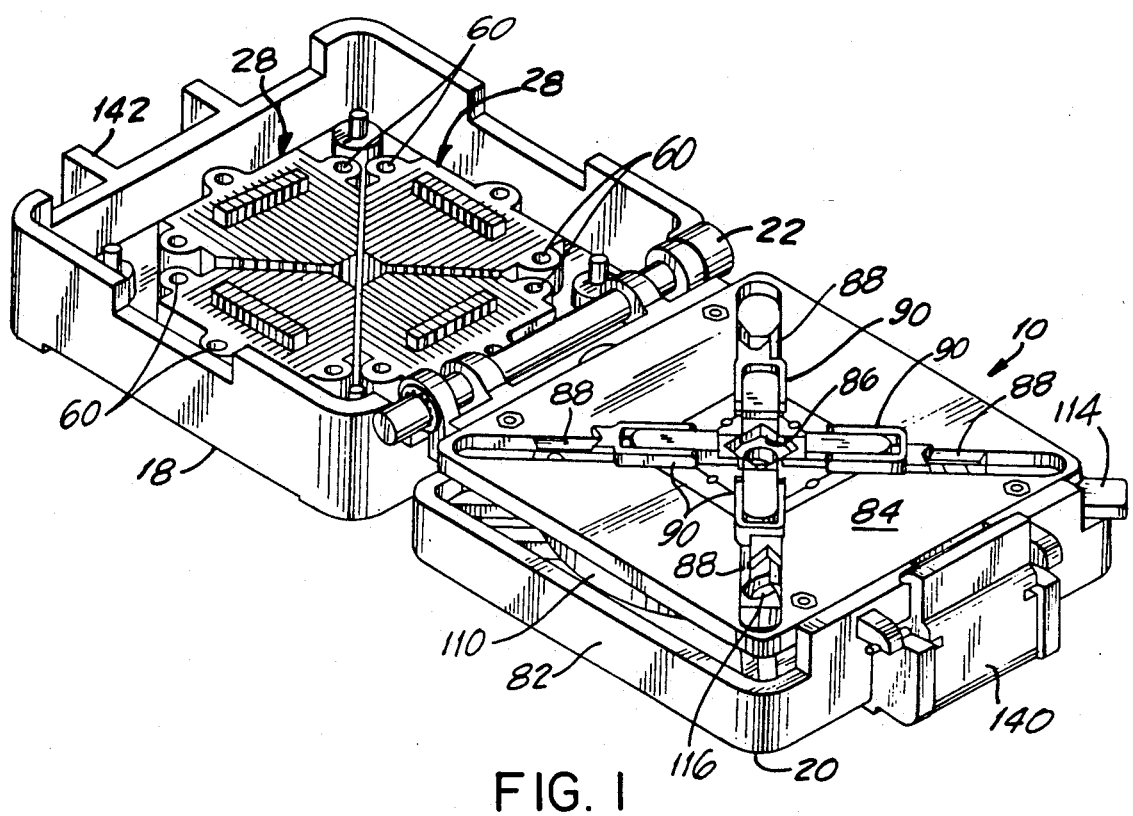
FIG. 1 is a perspective view of the universal LCC test socket of the subject invention in its open position.

In the following detailed description, reference will be made to a test socket assembly having a particular use with a leaded chip carrier (LCC), for according to the preferred embodiment and best mode of the invention, the test socket assembly is intended for use to test the operability of and the functions of a LCC packaged IC. However, it will be appreciated that the subject test socket assembly may be used with LCC's of different types than that herein shown and illustrated, and for electrical connection purposes other than testing purposes. Accordingly, the test socket assembly according to the preferred embodiment and best mode of the invention, is shown employed with an LCC or similar device having leads located along each of more than two sides and particularly four sides of either a rectangular or square LCC.

Referring now in detail to the drawings wherein like numerals indicate like elements throughout the several views, as illustrated in FIGS. 1-4, the universal test assembly according to the subject invention is designated generally by reference numeral 10. Test socket assembly 10 is intended to facilitate solderless electrical interconnection between the respective conductive leads of a leaded chip carrier (LCC) and a testing device (not shown), during a test and evaluation procedure. A LCC, indicated generally at 12 in FIG. 13, has a generally square configuration in top plan view with a plurality of leads 14 which are arranged in rows respectively along the four sides of the LCC housing 16. The latter is made of electrically non-conductive material which encapsulates a circuit chip electrically connected to the plurality of conductive leads 14. Each conductive lead 14 has a side portion extending out of and downwardly along the respective side of the housing body 16 and an upwardly turned bottom portion exposed at the bottom of the LCC 12 for connection to a respective solder land on a printed circuit board (not shown). In particular, the subject socket 10 enables the testing of either a rectangular or square configured LCC packaged IC, as more fully described hereinafter.

Figure 2:
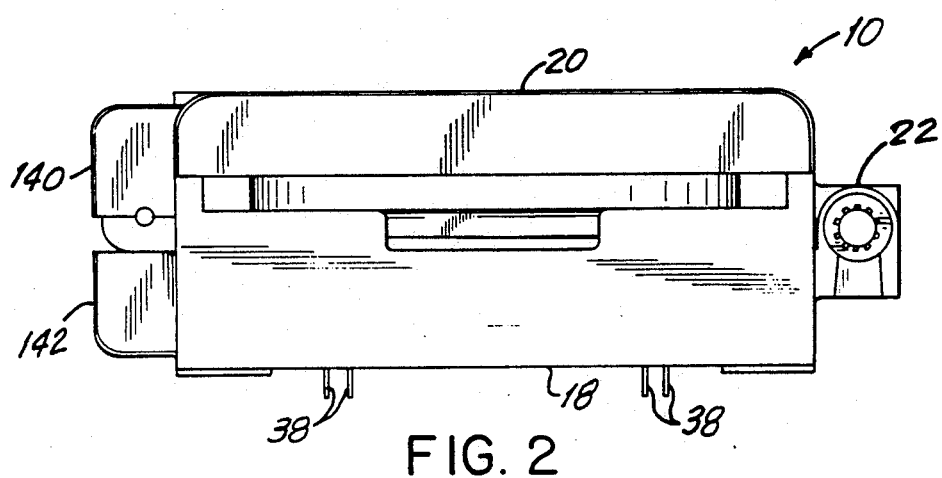
FIG. 2 is a side elevational view of the universal LCC test socket assembly in the closed position prior to registration with a testing apparatus.
Figure 3:
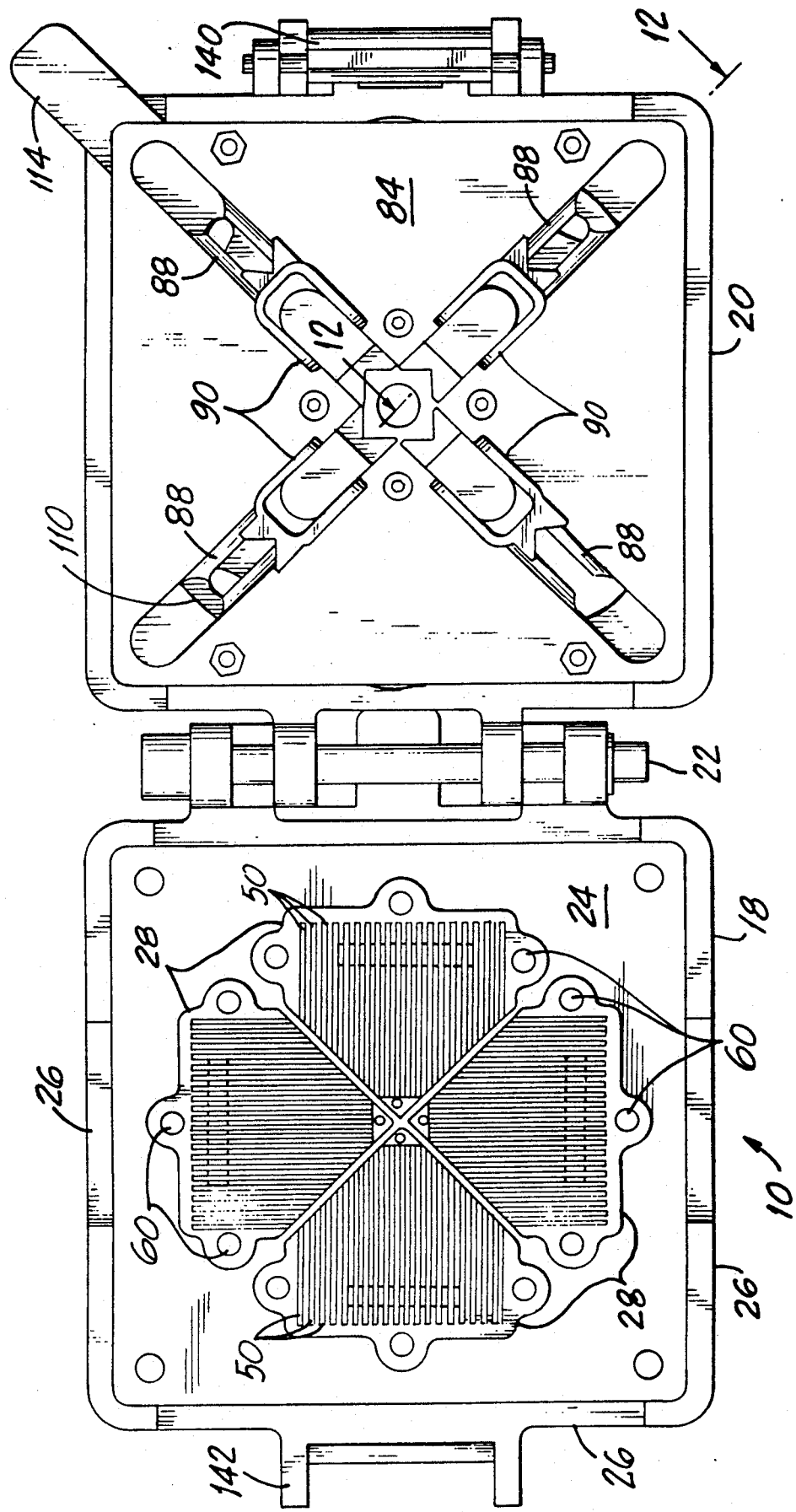
FIG. 3 is a top plan view of the new and improved test socket assembly of the subject invention in the open position.

As illustrated in FIGS. 1-3, the primary components of the test assembly include a non-conductive base assembly 18 and a non-conductive top assembly 20 that are hingedly connected to each other by hinge 22. In FIGS. 1 and 3, the test socket assembly 10 is shown in its open condition, while FIG. 2 illustrates the test socket assembly in its closed position, with the top assembly 20 being uniformly aligned atop the base assembly 18.

Figure 4:
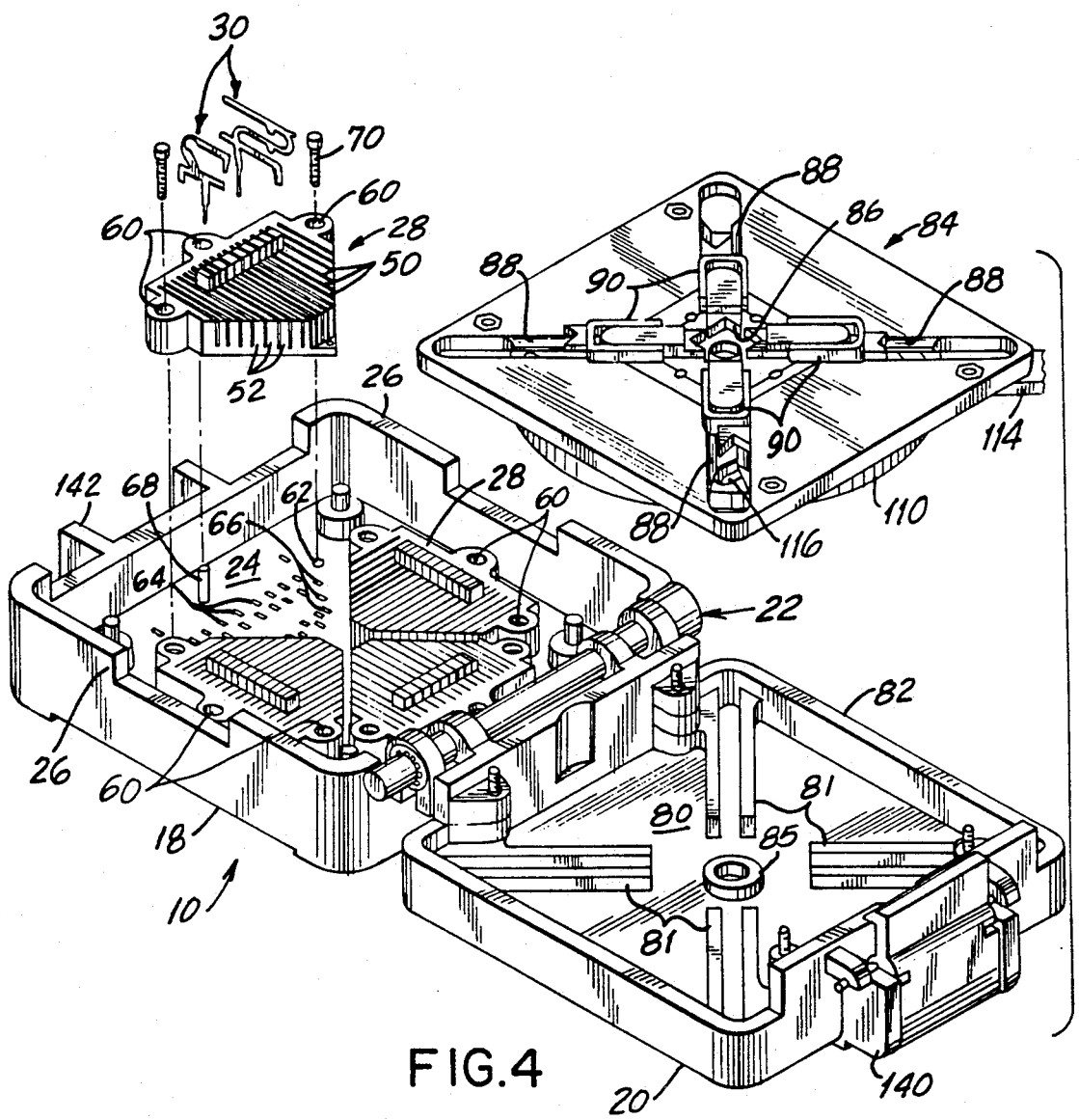
FIG. 4 is an exploded perspective view of the universal LCC test socket assembly of the subject invention.
Figures 5, 6, 7, 8:
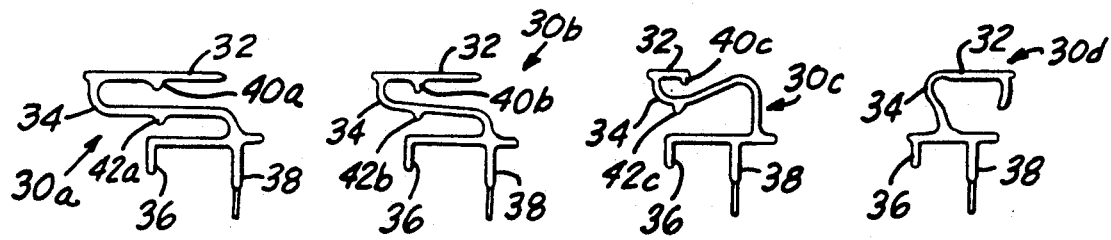
FIGS. 5-8 are side elevational views illustrating the different configurations of the electrical contacts of the universal LCC assembly of the subject invention.

Turning to FIGS. 3 and 4, the non-conductive base assembly 18 is a generally square member constructed of a dielectric plastic material which is extremely hard and heat resistant. The base assembly 18 includes a planar bottom wall 24 with integral sidewalls 26 extending upwardly therefrom. Mounting on the upper surface of the planar bottom wall 24 of the base assembly 18 are four identical contact assemblies 28. As illustrated in FIG. 4, each contact assembly 28 is preferably an integrally molded structure configured to accommodate a plurality of electrical conductive contacts 30. Each electrical conductive contact 30 is made of a suitable electrical conductive material such as copper. Furthermore, as shown in FIGS. 5-8, each electrical conductive contact 30 is formed in one of four different configurations, designated as 30(a), 30(b), 30(c), and 30(d). Each configuration 30(a)-30(d) is characterized by a contact strip portion 32 connected to an elbow portion 34 extending to a stabilizing pin portion 36 and the depending contact pin 38. The conductive contact strip portion 32 of each electrical conductive contact is dimensioned to be accommodated within the different length slots in the contact assembly 28 to effectively achieve a temporary electrical connection. Each contact pin 38 of each conductive contact 30 is dimensioned to be slidably received into a test socket of a testing device (not shown). Furthermore, each stabilizing pin portion 36 of each contact 30 functions to effectively stabilize the contact when it is disposed in a contact assembly 28. The elbow portion 34 of each contact 30 effectively functions as a biasing member to enable the contact strip portion 32 to resiliently contact a conductive lead 14 of a LCC 12 without undue harmful pressure between the contact 30 and conductive lead 14 of a LCC 12. As shown in FIGS. 5-7, depending from each contact strip portion 32 is a protrusion 40(a)-40(c), and a similar protrusion 42(a)-42(c) depends from the elbow portion 36 of each contact. Furthermore, as will be noted from the embodiments of the contacts shown in FIGS. 5-8, each contact is in the form of an S-shaped configuration, from which depend the stabilizer pin portion 36 and the contact pin 38. The S-shaped configuration effectively provides two hinged connections from increasing the flexibility of the contacts 30, and the protrusions 40(a)-40(c) and 42(a)-42(c) insure that the pins are not overstressed as the LCC is forced into electrical connection with the contacts 30.

Figure 9:
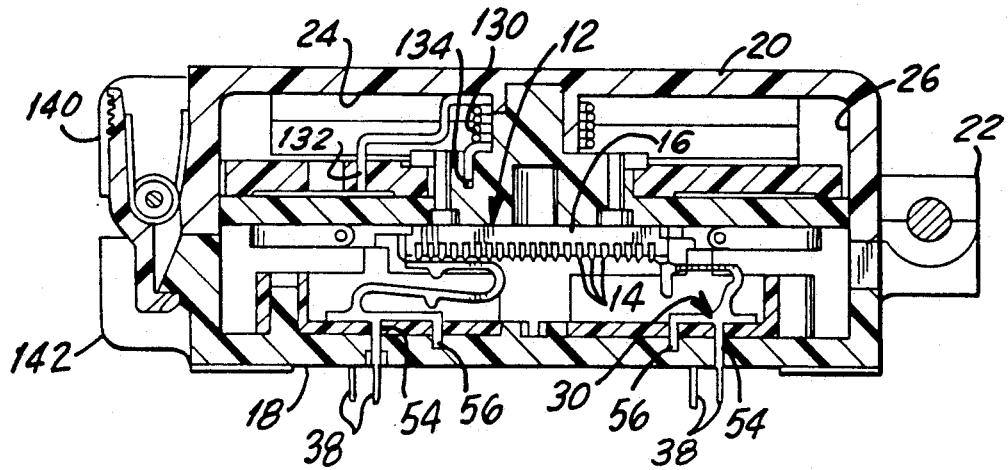
FIG. 9 is a cross-sectional view of the subject universal LCC test socket and illustrating a LCC mounted therein.

Turning back to FIG. 4, each contact assembly 28 is formed to include a plurality of parallel conductive contact receiving slots 50 which are spaced apart from each adjacent slot, preferably at a spacing of 0.050 inch. Additionally, each contact assembly 28 is provided with a plurality of parallel non-conductive insulating ribs 52, with each insulating rib functioning as a dielectric barrier between each adjacent conductive contact 30. As illustrated in FIG. 9, each respective contact receiving slot 50 is provided with an aperture 54 for the contact pin portion of each contact 30, and aperture 56 for the stabilizer pin portion of each contact. Securely fastening in each contact receiving slot 50 is a conductive contact 30 with its respective conductive pin portion 38 slidably received through aperture 54, while its stabilizing pin portion 36 is friction fitted through aperture 56.

Turning to FIG. 4, each contact assembly 28 includes a plurality of mounting apertures 60 to facilitate the mounting of the contact assembly 28 to the planar bottom wall 24 of the base assembly 18. The planar bottom wall 24 is also provided with a plurality of threaded holes 62, contact pin receiving apertures 64 and stabilizing pin sockets 66. Additionally, the planar bottom wall of the base assembly 16 is provided with four spaced apart mounting posts 68 which are dimensioned in accordance with the mounting apertures 50 provided on each contact assembly 28. The contact assemblies 28 mount to the bottom planar wall 24 of the base assembly 18 such that each mounting post 68 is slidably received in a mounting aperture 50 provided on each respective contacting assembly 28, while the remaining mounting apertures 50 of each respective contact assembly 28 are aligned with the threaded holes 62 provided in the bottom planar wall 24. A plurality of threaded screws 70 pass through the mounting apertures 50 and engage the threaded holes 62 for mounting of the contact assembly 28. Each electrical conductive contact 30 is slidably received in a contact receiving slot 50 of the contact assembly 28, with its respective conductive contact pin 38 being slidably received through a conductive pin aperture 64 extending below the outer surface of the bottom planar wall 24, as shown in FIGS. 2 and 9. Also, as shown in FIG. 9, each respective stabilizing pin portion 36 of contact 30 is frictionally engaged with the stabilizing pin socket 66 provided in the planar bottom wall 24 of the base assembly 18.

Referring to FIGS. 3 and 4, the non-conductive detachable top assembly 20 is a generally square member and is constructed of a dielectric plastic material which is extremely hard and heat resistant. The detachable top assembly 20 includes a planar bottom wall 80 and a perimeter sidewall 82, along with four radially extending sets of raised, parallel tracks, designated by the numeral 81. The detachable top assembly 20 has planar dimensions that are substantially equal to those of the non-conductive base assembly 18. As most clearly shown in FIG. 4, a planar dog plate 84 is mounted in spaced parallel relationship to the bottom planar wall 80 of the detachable top assembly 20. The planar dog plate 84 is preferably constructed of a dielectric plastic material, and has planar dimensions that are substantially equal to those of the planar bottom wall 80 of the top assembly 20. The dog plate 84 is provided with a center reference aperture 86, and intermediate the center aperture 86 and each respective corner of the plate 84 there is provided an elongated through dog slot 88 which is of generally V-shaped configuration.

Figure 10:
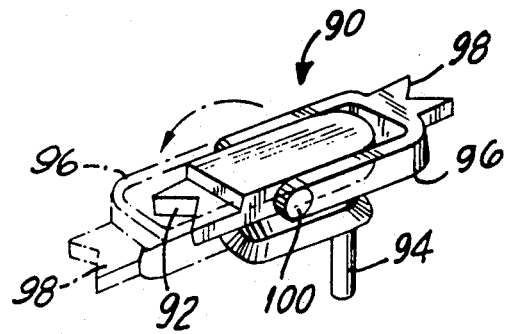
FIG. 10 is a perspective view of the gripper dog and attaching gripper adaptor of the subject invention.
Figure 12:
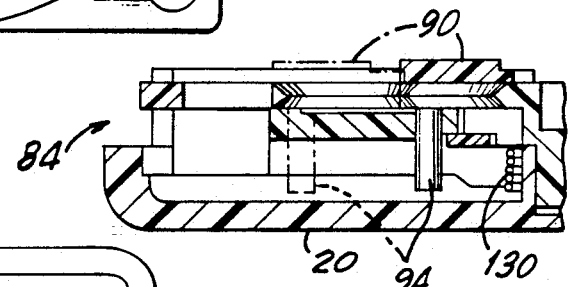
FIG. 12 is a partial cross-sectional view of the top assembly of the subject universal LCC test socket prior to registration with a LCC packaged IC.

Turning to FIGS. 1 and 10, slidably mounting in each dog slot 88 is a gripper dog 90, each of which is preferably constructed of a dielectric plastic material. In the assembled apparatus 10, the radially extending dog slots 88 overlie and are aligned with the parallel tracks 81 for accommodating the gripper dogs 90. Furthermore, each gripper dog 90 includes a 90° angled gripper member 92, a gripper post 94 and an adjustable gripper adaptor 96. The latter is a generally U-shaped member and includes a 90° angled gripper portion 98 which is offset orthogonal from the longitudinal axis of the gripper dog 90. The adjustable gripper adaptor 96 is pivotably connected to the gripper dog 90 through the hinged connection 100 for disposition in a first inactive position (shown in solid lines in FIG. 10) and a second active position (shown in dotted lines in FIG. 10). The base portion 102 of each gripper dog 62 from which the gripper post 94 depends is provided with an inverted V-shaped configuration 104 which is dimensioned to be compatible with the V-shaped configuration of the elongated dog slot 88 of the dog plate 84. The four gripper dogs 90 are slidably mounted in the four elongated dog slots 88 such that the four gripper dogs 90 are disposed adjacent the top surface of the dog plate 84, and with the respective 90° angled gripper members 92 facing the center reference aperture 86, while the four respective gripper posts 94 extend downwardly into the associated dog slots 88, as illustrated in FIG. 12. As more fully described hereinafter, each gripper post 94 enables sliding actuation of each gripper dog 90 along the length of the associated dog slot 88 in the dog plate 84. It is noted that the bottom surface of the dog plate 84 is provided with an outwardly projecting center post 85 which is mounted to the top assembly 20.

Figure 11:
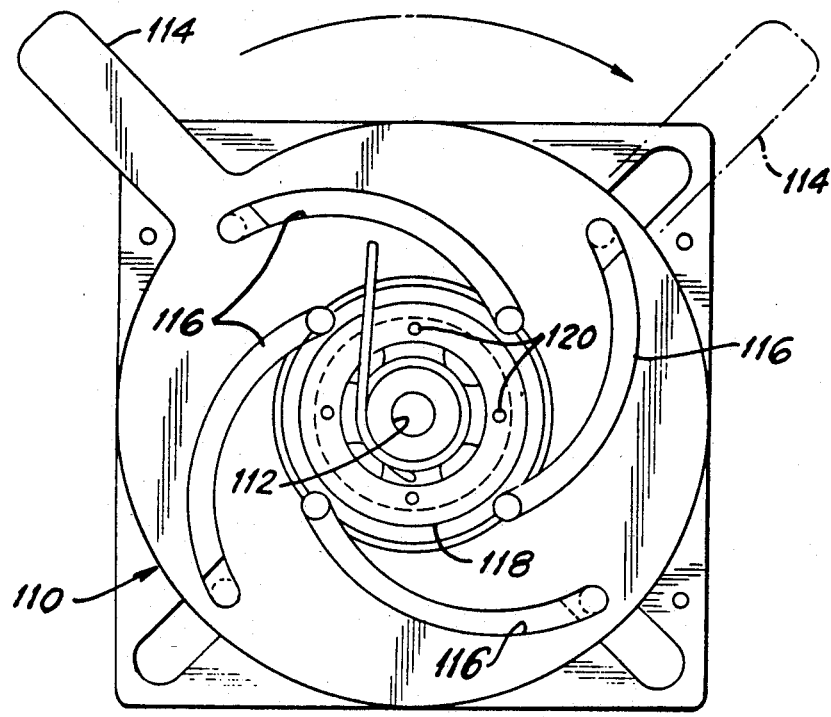
FIG. 11 is a plan view of the dog plate assembly illustrating the cam wheel in the initial rest position, with the arrow illustrating the direction in which cam wheel handle is moved to its maximum open position.

Turning to FIG. 11, a cam wheel 110 is rotatable mounted to the bottom surface of the dog plate 84. The cam wheel 110 is dimensioned such that the diameter of the cam wheel 110 is generally equal to the width of the dog plate 84. The cam wheel 110 is provided with a center aperture 112 that is dimensioned to be slidably received onto the center post 85 of the dog plate 84. Additionally, the outer circumferential edge of the cam wheel 110 is provided with an elongated cam wheel handle 114 which enables manual rotational movement of the cam wheel 110 relative to the dog plate 84. Intermediate the outer circumferential edge of the cam wheel 110 and its center aperture 112, four uniformly spaced identical cam slots 116 are provided in the plate to facilitate the reciprocal linear movement of the four gripper dogs 90 in the dog slots 88 of the dog plate 84. The cam wheel 110 is slidably mounted to the bottom surface of the dog plate 84 such that each gripper post 94 is slidably received in a cam slot 116, as shown in FIG. 12. A retainer washer 118 secures the cam wheel 110 to the bottom surface of the dog plate 84, and is fastened to the center post 85 through a plurality of threaded screws 120 which pass through the retainer washer 118 and threadingly engage threaded holes provided in the center post 85.

As shown in FIGS. 9 and 11, a torsion spring 130 biases rotation of the cam wheel 110 and the four gripper dogs 90. The torsion spring 130 includes ends 132, 134, with one end 132 being secured to the planar surface of the cam wheel 110, while the other end 134 is secured in the center post 85 of the dog plate 84. By this arrangement, the torsion spring 130 provides a biasing force to the dog plate 84 for maintaining the handle 114 in the position as shown in solid lines in FIG. 11. Accordingly, clockwise rotation of the handle 114 to the dotted line position (wherein the gripper dogs 90 are thus separated preparatory to receiving an LCC for testing) is accomplished in opposition to the torsional force of torsion spring 130.

As shown in FIG. 3, when the cam wheel handle 114 is in its rested position, the four gripper dogs 90 are uniformly positioned in close proximity to the center reference aperture 86 of the dog plate 84. When the cam wheel handle 114 is rotated to its maximum opening position, as shown in dotted lines in FIG. 11 and solid lines in FIG. 13, the four gripper dogs 90 are actuated radially outwardly (see FIG. 12) along their respective cam slot 116, until the four gripper dogs 90 are uniformly positioned in spaced relationship from the center reference aperture 86 of the dog plate 84 (see FIG. 13) for receiving an LCC therebetween.

Turning back to FIG. 3, a spring biased latch mechanism 140 and corresponding latch receiving socket 142 are attached respectively to the sidewalls of the base assembly 18 and the detachable top assembly 20 opposite from the hinged connection 22 of the assembly. As shown in FIGS. 2 and 9, when the latch mechanism 140 engages the latch receiving socket 142, the subject test socket assembly 10 is temporarily in a closed, locked position. As shown in FIG. 3, disengaging the latch mechanism 140 from the latch socket 142 enables the operator to pivotally separate the base assembly 18 from the top assembly 20, thereby positioning the subject socket 10 in an open position.

As also shown in FIG. 3, when the four conforming angled gripper members 64 of the four respective gripper dogs 92 face the center reference aperture 86 of the dog plate 84, the gripper dogs 90 are in a configuration to register a square configured LCC 12 to the surface of the dog plate 84. Alternatively, when the four respective gripper adapters 96 are rotated 180° to a position wherein their respective conforming members 98 face the center reference aperture 86 of the dog plate 84, the four gripper adapters 96 are in a configuration to register a rectangular LCC 12 to the surface of the dog plate 84, since each conforming member 98 is offset from the longitudinal axis of its respective gripper dog 90, as also shown in FIG. 10.

Figure 13:
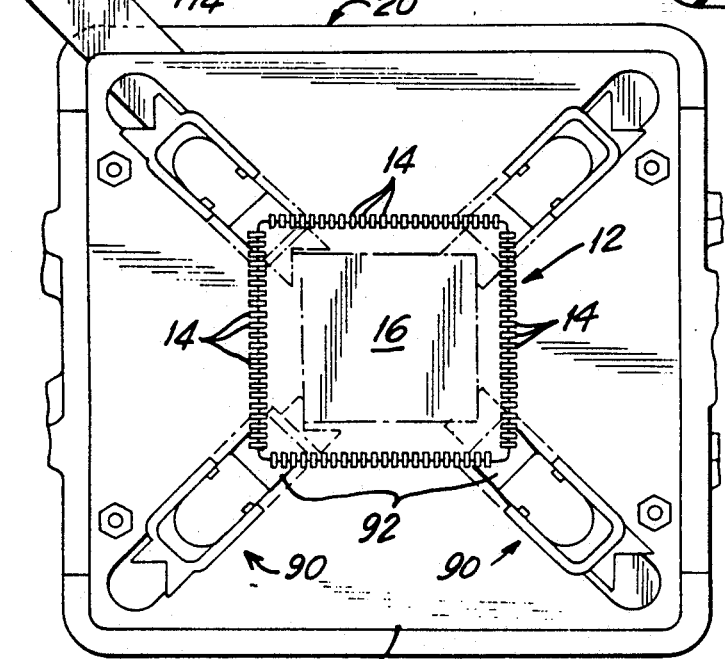
FIG. 13 is a plan view of the top assembly of the subject socket assembled with an LCC packaged IC.

In operation, with the universal LCC test socket 10 in its open condition, the operator temporarily secures a LCC packaged IC 12 in the subject socket 10 by first moving the elongated cam wheel handle 114 to the open position so as to separate the gripper dogs 90 and enable the operator to position the LCC packaged IC 12, with the bottom surface of the conductive leads face up, about the center reference aperture 86 of the dog plate 84. Next, the operator slowly allows the spring-biased elongated cam wheel handle 90 to slowly retract towards its initial rest position until such time as the four gripper dogs 90 engage the corners of the LCC 12, as shown in FIG. 13. The torsion spring 130 ensures that the cam wheel 110 remains in position and thus the LCC 12 is temporarily secured to the surface of the dog plate 84 of the detachable top assembly 20. Next, the operator rotates the top assembly 20 about the hinge 22 and locks the top detachable top assembly 20 to the base assembly 18 by engagement of the latch mechanism 140 of the base assembly 18 with the latch socket 142 of the top assembly 20, as shown in FIG. 2. Thereafter, as shown in FIG. 9, the bottom surface of each conductive lead 14 of the LCC 12 is forcibly urged into electrical contact, without undue pressure, with a corresponding conductive contact 30 in the base assembly 18. The operator then ensures that each conductive pin 38 which extends from each respective conductive contact 30 is electrically engaged in one of a plurality of sockets provided on the testing device (not shown). At this time, the operator then tests the electrical characteristics of the LCC 12 which is temporarily securely fastened in the subject universal LCC test socket assembly 10.

After the later testing procedure is completed, the operator disengages the latch mechanism 140 from the latch receiving socket 142, after which the operator pivotally rotates the base assembly 18 relative to the top assembly 20, thus positioning the subject socket 10 to its open position. The operator removes the LCC 12 from the top assembly 20 by actuating the elongated cam wheel handle 114 against the biasing force of the torsion spring 130 so as to radially outwardly move the gripper dogs 90 to their maximum opened position, thus enabling the operator to separate and remove the LCC 12 from the surface of the dog plate 84. Thereafter, the operator allows the elongated handle 90 to return toward its initial rest position.

As noted above, in the event that the LCC 12 is of rectangular configuration, the gripper adapters 96 are rotated about their hinged connection to the gripper dogs, such that the 90° gripper portions 98 are disposed radially inwardly and are thus in position for engaging the four corners of the LCC 12.

Also, it should be noted that the unique S-shaped configurations of the contacts 30, as shown in FIGS. 5-8, ensures sufficient flexibility of contacts to readily accommodate variations in the size of the leads 14 extending from the LCC 12.

While the invention has been described with respect to a preferred embodiment, it is apparent that various changes can be made without departing from the spirit and scope of the invention as defined by the appended claims.

What is claimed is:

1. A universal LCC test socket assembly for making solderless electrical connections between the contacting leads of an LCC packaged IC and a testing device for testing the electrical characteristics of the LCC, said LCC test socket assembly comprising:

a dielectric base member including a planar bottom wall having a plurality of pin receiving through-apertures and a plurality of stabilizing pin mounting holes;

a plurality of spaced apart contact assemblies mounted on said dielectric base member, each contact assembly including a plurality of parallel slots and apertures aligned with said plurality of pin receiving through-apertures and stabilizing pin mounting holes disposed in said base member;

a plurality of electrical connectors, each of which is disposed in a slot in one of said contact assemblies, each said electrical connector including a contact pin portion and a stabilizing pin portion, with the contact pin portion extending through an aperture in said contact assembly and through a pin receiving through-aperture in the base member for electrical connection to the testing device, while the stabilizing pin portion thereof extends through an aperture in a contact assembly and is disposed in a stabilizing pin mounting hole in the base member;

a dielectric top member connected to said base member and including a planar top wall; and a dog plate securing means mounted on said planar top wall of the top member for temporarily securing said LCC packaged IC to said top member whereby, with an LCC disposed in said dog plate securing means and with the top member being juxtaposed to said base member such that the respective top wall and planar bottom wall are in opposed relationship, the contacting leads of the LCC engage the plurality of electric connectors for establishing electrical connection between the LCC and the testing device.

2. A universal LCC test socket assembly for making solderless electrical connections between the connecting leads of an LCC packaged IC and a testing device for testing the electrical characteristics of the LCC as in claim 1 wherein each electrical connector includes an S-shaped conductive strip portion integrally formed with the contact pin portion and the stabilizing pin portion of the electrical connector.

3. A universal LCC test socket assembly for making solderless electrical connections between the connecting leads of an LCC packaged IC and a testing device for testing the electrical characteristics of the LCC as in claim 1 wherein the stabilizing pin portion of each electrical connector is frictionally engaged with the associated stabilizing pin mounting hole in the contact assembly for fixedly supporting the electrical connector in the contact assembly.

4. A universal LCC test socket assembly for making solderless electrical connections between the connecting leads of an LCC packaged IC and a testing device for testing the electrical characteristics of the LCC as in claim 1 wherein the dog plate securing means includes four radially extending and movable gripper dogs which respectively engage the four corners of the LCC for temporarily securing the LCC to the top member preparatory to testing.

5. A universal LCC test socket assembly for making solderless electrical connections between the connecting leads of an LCC packaged IC and a testing device for testing the electrical characteristics of the LCC as in claim 4 wherein the movable gripper dogs are spring biased toward their radially inward position for engaging the respective corners of the LCC.

6. A universal LCC test socket assembly for making solderless electrical connections between the connecting leads of an LCC packaged IC and a testing device for testing the electrical characteristics of the LCC as in claim 5 further including actuating means for simultaneously actuating the gripper dogs radially outwardly for gripping of the corners of the LCC.

7. A universal LCC test socket assembly for making solderless electrical connections between the connecting leads of an LCC packaged IC and a testing device for testing the electrical characteristics of the LCC as in claim 5 wherein each said gripper dog includes a gripper adaptor, with said gripper adaptor being provided with a 90° securing member that is offset from the central axis of said gripper dog whereby said gripper adaptors facilitate the temporary securing of a rectangularly-configured LCC to the top member of the test socket assembly.

8. A universal LCC test socket assembly for making solderless electrical connections between the connecting leads of an LCC packaged IC and a testing device for testing the electrical characteristics of the LCC as in claim 1 wherein said dielectric top member is hingedly connected to said dielectric base member.

9. A universal LCC test socket assembly for making solderless electrical connections between the connecting leads of an LCC packaged IC and a testing device for testing the electrical characteristics of the LCC as in claim 8 further including latch means for locking said top member to said base member.

10. A universal LCC test socket assembly for making solderless electrical connections between the connecting leads of an LCC packaged IC and a testing device for testing the electrical characteristics of the LCC as in claim 1 wherein the four contact assemblies are mounted on the planar bottom wall of the base member, with each contact assembly being generally triangular in configuration such that the contact assemblies interfit to enable the universal LCC test socket to accommodate various sizes of square and rectangular LCC's.

11. A universal LCC test socket assembly for making solderless electrical connections between the connecting leads of an LCC packaged IC and a testing device for testing the electrical characteristics of the LCC, said LCC test socket assembly comprising:

a dielectric base member including a planar bottom wall and a upstanding peripheral side wall, said dielectric base member having a plurality of pin receiving through-apertures and a plurality of stabilizing pin mounting holes provided in said bottom wall;

a plurality of spaced apart contact assemblies mounted on said dielectric base member, each contact assembly including a plurality of parallel slots and apertures aligned with said plurality of pin receiving through-apertures and stabilizing pin mounting holes disposed in the planar bottom wall of said base member;

a plurality of electrical connectors, each electrical connector being disposed in a slot in one of said contact assemblies, each said electrical connector including a contact pin portion and a stabilizing pin portion extending from an S-shaped conductive strip portion, with the contact pin portion extending through an aperture in said contact assembly and through a pin receiving through-aperture in the base member for electrical connection to the testing device, while the stabilizing pin portion thereof extends through an aperture in a contact assembly and is disposed in a stabilizing pin mounting hole in the base member;

a dielectric top member hingedly connected to said base member, said dielectric top member including a planar top wall and an upstanding peripheral wall; and a dog plate securing means mounted in said dielectric top member and secured to said planar top wall for temporarily securing said LCC packaged IC to said top member whereby, with an LCC disposed in said dog plate securing means and with the top member being rotated about said hinge means such that the respective top wall and planar bottom wall are in opposed relationship, the leads of the LCC engage the S-shaped portion of the electrical connectors as disposed in the contact assemblies for establishing electrical connection between the LCC and the testing device.

12. A universal LCC test socket assembly for making solderless electrical connections between the connecting leads of an LCC packaged IC and a testing device for testing the electrical characteristics of the LCC as in claim 11 wherein the dog plate securing means includes four radially extending and movable gripper dogs which respectively engage the four corners of the LCC for temporarily securing the LCC to the top member preparatory to testing.

13. A universal LCC test socket assembly for making solderless electrical connections between the connecting leads of an LCC packaged IC and a testing device for testing the electrical characteristics of the LCC as in claim 12 wherein the movable gripper dogs are spring biased toward their radially inward position for engaging the respective corners of the LCC.

14. A universal LCC test socket assembly for making solderless electrical connections between the connecting leads of an LCC packaged IC and a testing device for testing the electrical characteristics of the LCC as in claim 13 further including actuating means for simultaneously actuating the gripper dogs radially outwardly for facilitating gripping of the corners of the LCC.

15. A universal LCC test socket assembly for making solderless electrical connections between the connecting leads of an LCC packaged IC and a testing device for testing the electrical characteristics of the LCC as in claim 14 wherein each said gripper dog includes a gripper adaptor, with said gripper adaptor being provided with a 90° securing member that is offset from the central axis of said gripper dog whereby said gripper adaptors facilitate the temporary securing of a rectangularly-configured LCC to the top member of the test socket assembly.

16. A universal LCC test socket assembly for making solderless electrical connections between the connecting leads of an LCC packaged IC and a testing device for testing the electrical characteristics of the LCC as in claim 11 further including latch means for locking said top member to said base member.

17. A universal LCC test socket assembly for making solderless electrical connections between the connecting leads of an LCC packaged IC and a testing device for testing the electrical characteristics of the LCC as in claim 11 wherein the four contact assemblies are mounted on the planar bottom wall of the base member, with each contact assembly being generally triangular in configuration such that the contact assemblies interfit to enable the universal LCC test socket to accommodate various sizes of square and rectangular LCC's.

* * * * *